United States Patent
Stewart

[19]

[11] Patent Number: 5,912,907
[45] Date of Patent: *Jun. 15, 1999

[54] SATELLITE RECEIVER CODE RATE SWITCHING APPARATUS

[75] Inventor: John Sidney Stewart, Indianapolis, Ind.

[73] Assignee: Thomson Consumer Electronics, Inc., Indianapolis, Ind.

[*] Notice: This patent issued on a continued prosecution application filed under 37 CFR 1.53(d), and is subject to the twenty year patent term provisions of 35 U.S.C. 154(a)(2).

[21] Appl. No.: 08/640,883

[22] PCT Filed: Nov. 22, 1993

[86] PCT No.: PCT/US93/11338

§ 371 Date: May 8, 1996

§ 102(e) Date: May 8, 1996

[87] PCT Pub. No.: WO95/15033

PCT Pub. Date: Jun. 1, 1995

[51] Int. Cl.⁶ .................................................. H03M 13/00
[52] U.S. Cl. .......................................................... 371/41
[58] Field of Search ........................................ 371/41, 5.5

[56] References Cited

U.S. PATENT DOCUMENTS

| | | | |
|---|---|---|---|
| 4,047,151 | 9/1977 | Rydbeck et al. | 340/146.1 |
| 4,309,764 | 1/1982 | Acampora | 370/83 |
| 4,901,319 | 2/1990 | Ross | 371/45 |
| 4,908,827 | 3/1990 | Gates | 371/43 |
| 4,932,029 | 6/1990 | Heichler | 371/43 |
| 5,128,942 | 7/1992 | Kojima | 371/5.5 |
| 5,151,904 | 9/1992 | Reiner et al. | 371/43 |
| 5,157,672 | 10/1992 | Kondou et al. | 371/43 |
| 5,230,003 | 7/1993 | Dent et al. | 371/43 |
| 5,231,494 | 7/1993 | Wachob | 358/146 |
| 5,430,743 | 7/1995 | Marturano et al. | 371/43 |
| 5,438,590 | 8/1995 | Tzukerman et al. | 375/259 |
| 5,453,997 | 9/1995 | Roney, IV | 371/41 |
| 5,511,079 | 4/1996 | Dillon | 371/43 |
| 5,566,206 | 10/1996 | Butler et al. | 375/225 |

FOREIGN PATENT DOCUMENTS

| | | | |
|---|---|---|---|
| 255 065 A2 | 2/1988 | European Pat. Off. | H04L 1/00 |
| 327 101 A2 | 8/1989 | European Pat. Off. | H04J 3/16 |

OTHER PUBLICATIONS

Yasuda et al., "Development of Variable–Rate Viterbi Decoder and Its Performance Characteristics", Sixth Int'l. Conf. on Digital Satellite Communication, Sep. 1983, pp. XII–24–XII–31.

Yasuda et al., "High–Rate Punctured Convolutional Codes for Soft Decision Viterbi Decoding", IEEE Trans. on Communications, vol. COM–32, No. 3, Mar. 1984, pp. 315–319.

Khan et al., "Further Studies on Efficient AFEC Schemes for Ka–Band Satellite Systems", IEEE Trans. on Aerospace and Electronic Systems, vol. AES–25, no. 1, Jan. 1989, pp. 9–20.

(List continued on next page.)

Primary Examiner—Stephen M. Baker
Attorney, Agent, or Firm—Joseph S. Tripoli; Eric P. Herrmann; Ronald H. Kurdyla

[57] ABSTRACT

A satellite signal receiver includes an input demodulator followed by a Viterbi decoder and a Reed-Solomon decoder. A received signal is encoded with information including error-representative information, and exhibits an error correction code rate which is a function of the power level of a satellite transmitted signal. The demodulator produces control signals representing the presence or absence of synchronism with the received signal, and signal quality (e.g., signal-to-noise ratio). The Reed-Solomon decoder produces a control signal indicating whether or not error detection and correction is occurring properly. These control signals are sensed by a control network to change the code rate of the Viterbi decoder if necessary.

10 Claims, 4 Drawing Sheets

OTHER PUBLICATIONS

Shiozaki et al., "A Hybrid ARQ Scheme with Adaptive Forward Error Correction for Satellite Communications", IEEE Trans, on Communications, vol. 39, No. 4, Apr. 1991, pp. 482–484.

Vucetic,"An Adaptive Coding Scheme for Time–Varying Channels", IEEE Trans. on Communications, vol. 39, No. 5, May 1991, pp. 653–663.

IEEE Transactions on Communications, vol. 40, No. 1, Jan. 1992, Pursley, Michael et al., "Variable Rate Hybrid ARQ for Meteor–Burst Communications", Parts I–III (part IIIc. pp. 65–67).

IEEE Journal on Selected Areas in Communications, vol. 10, No. 2, Feb. 1992, Kim, Snag Wu, "Frequency–Hopped Spread–Sprectrum Random Access with Retransmission Cutoff and Code Rate Adjustment", pp. 344–345, parts I–II.

SATELLITE RECEIVER CODE RATE SWITCHING APPARATUS

This invention is related to the field of digital satellite communication systems, and more particularly to error correcting apparatus in a receiver in such a system.

BACKGROUND OF THE INVENTION

Currently, a satellite may receive a signal representing audio, video or data information from a transmitter. The satellite amplifies and broadcasts this signal to a receiver via a communication channel at a specified frequency and bandwidth. Since communications channels are subject to errors due to noise within the channel itself and to external sources, error correction is desirable. One technique for reducing or eliminating errors is Forward Error Correction (FEC). This technique sends a certain amount of extra information along with the original information. When errors occur, the receiver uses the extra information to locate and correct errors without further communication with the transmitter.

Two widely used types of forward error correction systems employ convolutional coding and block coding. Convolution coding operates on a continuum of data which is serially and continuously conveyed to an encoder. A convolutional encoder analyzes the current data and some amount of previous data. The encoder adds error correction data to the current data, thereby creating a new data signal. The system then outputs a continuous stream of the new data at a higher rate, either more data being transmitted faster, or more data over a longer time period. The receiver is conditioned to analyze a signal encoded with the convolutional error coding method used by the transmitter.

Block coding, such as Reed-Solomon coding, encodes the data signal with additional error correcting data using a specified algorithm. In a Reed-Solomon encoder, data is typically divided into equal sized units or blocks of a convenient size. Using a Reed-Solomon algorithm, these blocks have data added to them in some manner that is dependent upon the data itself. This process creates a new block of somewhat larger size that may or may not resemble the original data. However, by the receiver understanding the coding scheme used, the new block of data may be analyzed and the original data extracted, even if errors have been created in the data.

Each type of error coding has an associated code rate based on the number of bits entering the encoder divided by the number leaving it. Thus if 750 bits of data enter, 250 bits of error correction code are added, and 1000 bits (750+250) are output, the code rate is said to be a 3/4 (750/1000) code rate, and the apparatus is said to run at a 3/4 error correction coding rate. This is sometimes referred to as rate 3/4 forward error correction.

These same rates designate the error decoding rate used by a decoder, although the reverse operation is performed. For example, 1000 bits of data may be input, 250 of which are error correction code and the remaining 750 bits are data. The 250 bits of error correction code are removed from the data signal and used to detect and correct errors in the data signal. The remaining 750 bits of data are output. The decoder is said to run at a 3/4 error correction decoding rate.

The amount of error correcting information encoded into a data signal may depend, in part, on the operation of the satellite. For example, a satellite broadcast system may operate in two power modes, low and high. At high power, the signal received and transmitted by the satellite is stronger. As a result, the quality of a received signal is improved, and less error correction coding is required to obtain a desired data quality. For example, at high power, transmitted data may be approximately 25% error correction data and 75% usable data. Similarly, when the satellite operates at low power, the signal transmitted and received is weaker. Additional error correction data is therefore required to achieve the desired data quality. For example, at low power, approximately 40% of the transmitted data is error correction data and approximately 60% is usable data.

A desirable error correction coding rate will maximize the usable data and minimize the error correction data transmitted. If insufficient error correction data is included in the transmitted signal, the signal will not be received reliably, if at all, by the receiver. If excessive error correction data is included, the signal will be received correctly, but a lesser percentage of the output signal will be available for real data than if the error correction data had been matched to the transmitting power of the satellite.

SUMMARY OF THE INVENTION

In accordance with the principle of the present invention, it is herein recognized that it is desirable to match the rate of error correction coding to the differing power levels of a satellite. Accordingly, error correction coding rates are a function of differing power levels of the satellite, which coding rate may change without direct notification to a receiver. A receiver senses that the error correction code rate has been altered at the transmitter, and in response alters the error correction decoding rate used by the receiver.

DETAILED DESCRIPTION OF THE DRAWINGS

Figure 1:
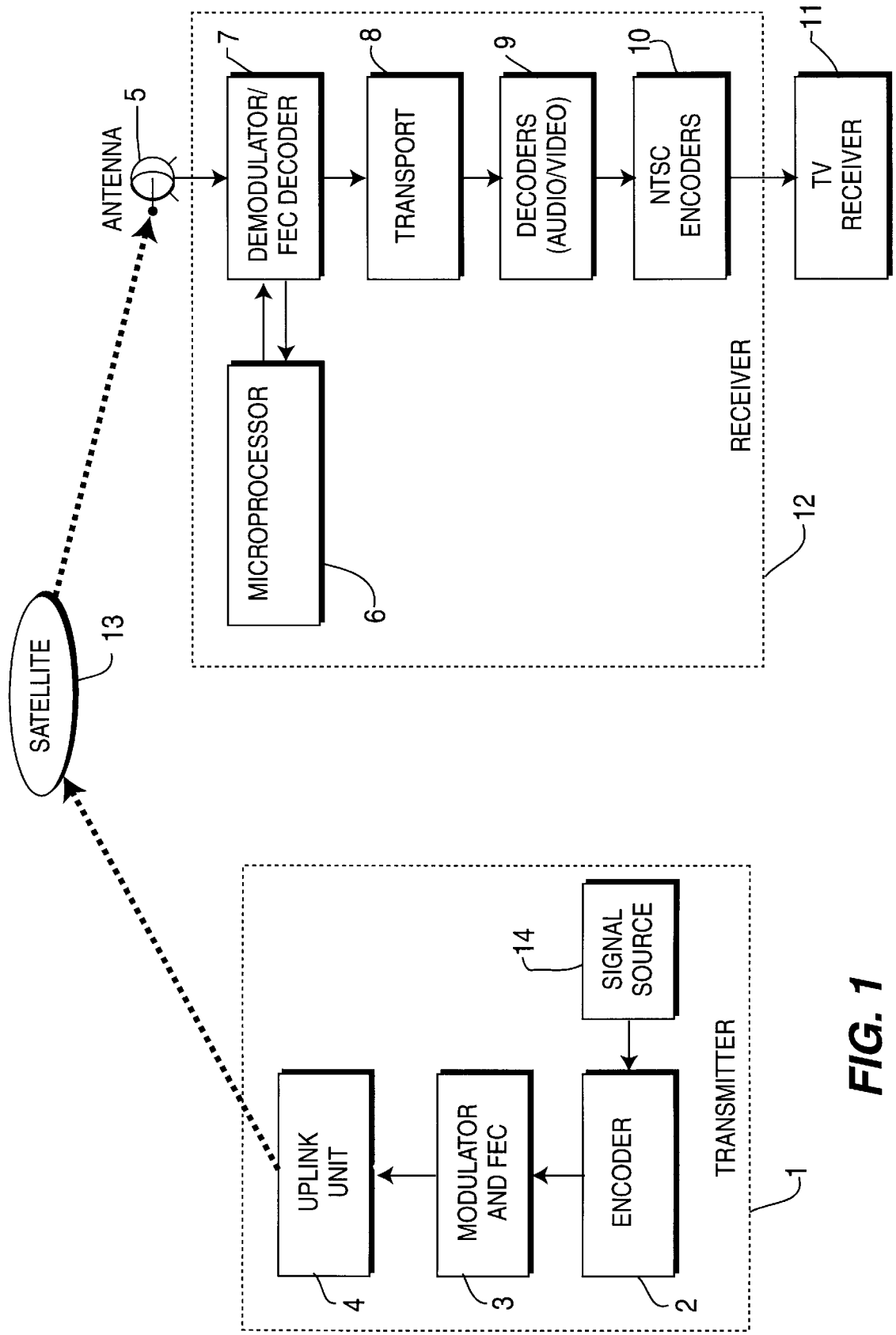
FIG. 1 is a block diagram of a satellite transmitting/receiving system including apparatus according to the invention.

The system of FIG. 1 includes a transmitter 1 which processes a data signal from a source 14 (e.g., television signal source) and transmits it to a satellite 13 which receives and rebroadcasts the signal to a receiver 12. Transmitter 1 includes an encoder 2, a modulator/forward error corrector (FEC) 3, and an uplink unit 4. Encoder 2 compresses and encodes signals from source 14 according to a predetermined standard such as MPEG. (MPEG is an international standard developed by the Moving Pictures Expert Group of the International Standards Organization for coded representation of moving pictures and associated audio stored on digital storage medium.) An encoded signal from unit 2 is supplied to modulator/Forward Error Corrector (FEC) 3, which encodes the signal with error correction data, and Quaternary Phase Shift Key (QPSK) modulates the encoded signal onto a carrier. Both convolutional and RS block coding are performed in block 3.

Uplink unit 4 transmits the compressed and encoded signal to satellite 13, which broadcasts the signal to a selected geographic reception area. In this embodiment, satellite 13 operates in two modes, which trade off channel capacity and transmission power. In the first mode, satellite 13 illustratively transmits 16 channels at 120 watts each. In the second mode, satellite 13 transmits 8 channels at 240 watts each.

The signal from satellite 13 is received by an antenna 5 coupled to an input of a so-called set-top receiver 12, e.g., an interface device situated atop a television receiver. Receiver 12 includes a demodulator/Forward error correction (FEC) decoder 7 to demodulate the signal and to decode the error correction data, a microprocessor 6 which operates interactively with demodulator/FEC 7, and a transport 8 to transport the signal to an appropriate decoder within unit 9 depending on the content of the signal, i.e., audio or video information. Transport unit 8 receives corrected data packets from unit 7 and checks the header of each packet to determine its routing. Decoders in unit 9 decode the signal and remove added transport data if used. An NTSC Encoder 10 encodes the decoded signal to a format suitable for use by signal processing circuits in a standard NTSC consumer television receiver 11.

Figure 2:
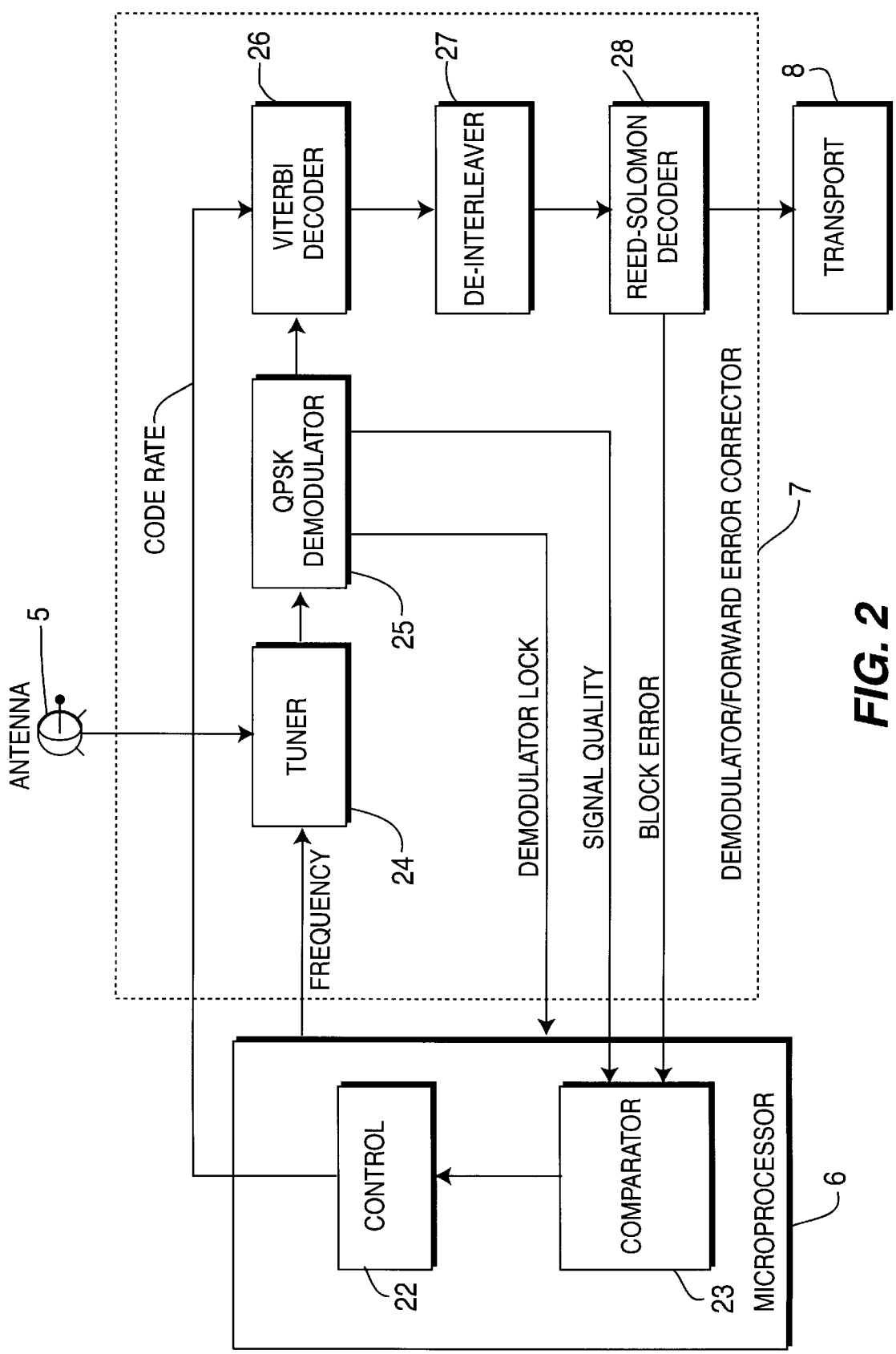
FIG. 2 is a block diagram of a portion of the receiver in FIG. 1, including a demodulator/forward error correction unit in accordance with the invention.

Referring now to FIG. 2, demodulator/FEC unit 7 acquires, demodulates, and decodes the data signal which is received from antenna 5. This unit includes a tuner 24, a Quaternary Phase Shift Keyed (QPSK) demodulator 25, a Viterbi convolutional decoder 26, a de-interleaver 27, and a Reed-Solomon (RS) decoder 28, all of conventional design, arranged as shown.

Tuner 24 receives an input signal from antenna 5. Based upon a user's channel selection, a control unit 6, e.g., a microprocessor, sends a Frequency signal to tuner 24. This signal causes tuner 24 to tune to the appropriate channel and to frequency downconvert the received signal in response to the tuning frequency sent to tuner 24 from microprocessor 6. An output signal from tuner 24 is provided to QPSK demodulator 25.

QPSK demodulator 25 locks onto (synchronizes with) the tuned channel, demodulates the modulated data signal, and generates a signal indicative of the quality of the demodulated signal. Demodulator 25 demodulates the modulated input data signal regardless of the error correction code rate of the received data signal. Phase locked loop circuitry in demodulator 25 synchronizes the operation of demodulator 25 with the input signal using well known techniques. Demodulator 25 generates a Demodulator Lock output control signal that indicates whether or not demodulator 25 is synchronized with the input signal, and supplies this signal to a storage register in microprocessor 6. An output demodulated data signal from unit 25 is provided to Viterbi decoder 26. Demodulator 25 also generates an output Signal Quality signal. This signal represents the quality of the signal received from the satellite transmission, and is related to the signal-to-noise ratio of the received signal. Various sources of noise, as well as rain fade, may impair the quality of a received signal. A QPSK demodulator suitable for use as unit 25 is commercially available from Hughes Network Systems of Germantown, Md. (integrated circuit type No. 1016212), and from Comstream Corp., San Diego, Calif. (No. CD2000).

Decoder 26 uses a Viterbi algorithm to decode and to correct bit errors in the demodulated signal from unit 25. Decoder 26 includes internal networks, as known, to synchronize its operation to the incoming demodulated signal in order to effectively decode the demodulated signal.

Decoder 26 operates at one of two error correction decoding rates, which correspond to error correction coding rates provided at the transmitter. When satellite 13 operates in the low power mode, the transmitted signal uses a rate 2/3 error correction code. When satellite 13 operates in the high power mode, the transmitted signal uses a rate 6/7 error correction code. A Code Rate control signal developed by control unit 22 in microprocessor 6 indicates which error correction code rate decoder 26 should use. The Code Rate control signal may be a binary signal with one logic level signifying that the code rate used by unit 26 should remain unchanged, and another logic level causing unit 26 to switch to another programmed code rate. The Code Rate control signal is provided by a block 22 in response to an output from a digital comparator 23. Comparator 23 provides an output logic state as a function of the logic state of input control signals, e.g., Signal Quality and Block Error, as will be discussed. These signals are applied to storage registers which are monitored by comparator 23. After decoder 26 decodes and error corrects the demodulated data signal, the decoded data signal is supplied to a de-interleaver 27. De-interleaver 27 restores the ordering of the data signal to its original sequence, and forms Reed-Solomon blocks (RS blocks), in accordance with known techniques. For this purpose de-interleaver 27 relies upon an 8-bit sync word inserted by the encoder at the beginning of each RS block, thereby providing RS block synchronization. The de-interleaved signal is supplied to a Reed-Solomon (RS) decoder 28.

RS decoder 28 decodes the RS blocks and corrects byte errors within the block, using a decode rate of 130/146, for example. The 8-bit sync byte word appended to each Reed-Solomon block facilitates locating the beginning of each Reed-Solomon block. An effective RS decode rate of 130/147 results from the use of the appended sync word. This 8-bit sync byte word is removed by de-interleaver 27 before Reed-Solomon decoding, so that only 146 bytes per block are RS decoded.

RS decoder 28 also provides error detection when the number of errors in a block exceeds the correction capability of the RS code. For example, RS decoder 28 may correct up to eight byte errors within a block. If more than eight byte errors are detected, RS decoder 28 produces an output Block Error signal with, e.g., a binary signal with a high logic level to indicate that more errors exist than can be corrected. An uncorrectable RS block is discarded and not used. If an RS block is RS decodable within the prescribed eight byte parameters, the decoded signal is supplied to transport unit 8. The disclosed combination of a Viterbi algorithm convolutional decoder followed by an RS block decoder has been found to produce very good error detection/correction results, particularly in the error rate and signal-to-noise environment commonly associated with satellite transmissions.

The transmitter (unit 3 in FIG. 1) may change the error correction code rate at any time without notifying receiver demodulator/decoder 7 of the change. In this example, the system supports two (Viterbi and RS) error correction code rates: 2/3*130/147 at low satellite power, and 6/7*130/147 at high satellite power. When the power mode is switched, the error correction code rate may be switched. Since the error correction coding rate of RS decoder 28 at the receiver remains constant (130/147), only the Viterbi decoder error correction decoding rate need be altered by switching from one programmed rate to another (2/3 to 6/7 or vice-versa). The error correction decoding rate used by Viterbi decoder 26 is altered through use of the Code Rate control signal supplied by microprocessor 6. Microprocessor 6 establishes the state of the Code Rate signal in response to the state of the Block Error signal from RS decoder 28. Microprocessor 6 may also respond to a signal from demodulator 25 to determine the state of the Code Rate signal, as will be discussed.

Various conditions may cause the receiver error correction decode rate to be uncertain. For example, when the system is operating using one error correction decode rate, the rate may be switched at the transmitter or the channel changed to a channel for which the error correction rate is not known. In accordance with the invention, the use of an incorrect error correction decode rate is detected, and the error correction decode rate is changed. This may be achieved by analyzing the success of decoding by RS decoder 28 as indicated by the Block Error signal. This may also be achieved by analyzing the quality of the data signal, as determined by QPSK demodulator 25, relative to the success of RS decoding as determined by the Block Error signal from RS decoder 28. In each case, demodulator 25 synchronizes itself to the incoming data signal. The power level of a received satellite signal and the error correction coding rate are transparent to demodulator 25. Demodulator 25 will therefore always attempt to demodulate the received data signal, and supply the demodulated signal to Viterbi decoder 26.

A decoded signal from Viterbi decoder 26 is provided to RS decoder 28 via de-interleaver 27. If decoder 26 uses the proper error correction decode rate to decode the data signal, de-interleaver 27 and Reed-Solomon decoder 28 will operate normally. In such case the Block Error signal will exhibit a given state, e.g., a logic "low" level, indicating normal decoding. If decoder 26 is using an incorrect error correction code rate for a given input signal, it is unlikely that decoder 28 will provide a normal output. In such case the Block Error signal will exhibit a different state, e.g., a logic "high" level, to signify an abnormal output from RS decoder 28. In each case, the Block Error signal is analyzed to determine if the error correction code rate used by Viterbi decoder 26 should be changed.

Figure 3:
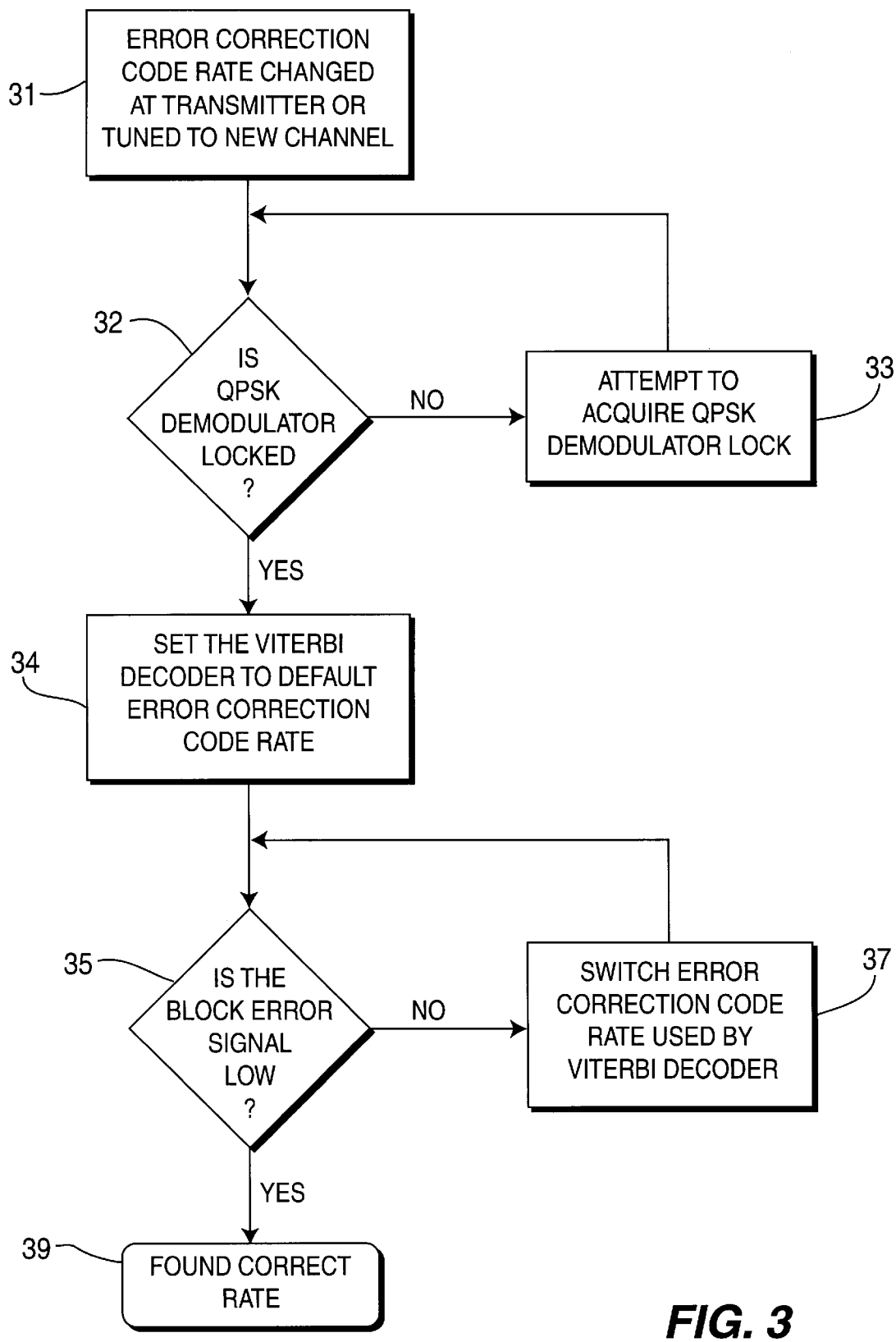
FIG. 3 is a flowchart to aid in understanding a sequence of events which occur in controlling the apparatus shown in FIG. 2.

FIG. 3 is a flow chart which illustrates a sequence of events occurring at the receiver when, for example, the error correction code rate is changed at the transmitter. This change may cause a perturbation to appear in the transmitted data signal because of the modulator switching to the new error correction code rate. A perturbation may also occur due to rain fade, or tuning to a new channel. Such a perturbation may cause the QPSK demodulator at the receiver to lose synchronization with the data signal.

Considering FIG. 3 with FIG. 2, when demodulator 25 loses synchronization (lock) with the data signal, logic circuits in demodulator 25 generate, e.g., a high logic level Demodulator Lock signal (step 31) to indicate the loss of synchronization. Demodulator 25 attempts to re-synchronize with the input data signal until the data signal is strong enough for proper reception (steps 32 and 33). When demodulator 25 regains synchronization, the Demodulator Lock signal exhibits a low logic level to indicate that synchronization has been acquired. Viterbi decoder 26 is then set to a default error correction code rate (step 34) by microprocessor 6, through use of the Code Rate signal. The default code rate is a pre-programmed one of the available code rates.

When demodulator 25 loses synchronization with the data signal, synchronization circuitry associated with Viterbi decoder 26 typically will be unable to synchronize with the signal from the output of the demodulator. As a result, incorrect information will be provided to the core of the Viterbi decoder, and the Viterbi decoder will output an abnormal signal. In such case de-interleaver 27 will be unable to locate and use the inserted 8-bit sync word for aligning the RS blocks. RS decoder 28 therefore will be unable to properly decode the output signal from Viterbi decoder 26, and the level of the Block Error signal will indicate improper decoding by RS decoder 28.

A predetermined period of time after demodulator 25 has regained synchronization, microprocessor 6 will examine the Block Error signal (step 35). If the Block Error signal state (low) indicates normal decoding, the (default) error correction code rate being used by Viterbi decoder 26 is assumed to correspond to the transmitted code rate (step 39). Alternatively, if the Block Error signal exhibits another state (high) indicating abnormal decoding, the error correction code rate of Viterbi decoder 26 is assumed to be incorrect, since if Viterbi decoder 26 is using an incorrect error correction coding rate, RS decoder 28 is unlikely to be able to provide normal RS block decoding. Microprocessor 6 then provides a Code Rate signal with a state indicating that the error correction code rate of Viterbi decoder 26 should be changed (step 37).

The Block Error signal is checked at predetermined intervals by comparator 23 of microprocessor 6. The Viterbi error correction code rate will be switched between the available error correction code rates until the Block Error signal exhibits a state indicating that the data signal is being normally decoded.

Tuning to a new channel may not necessarily result in demodulator 25 losing synchronization. If synchronization is lost during a channel change, the process described above involving steps 35, 37 and 39 will be repeated.

Figure 4:
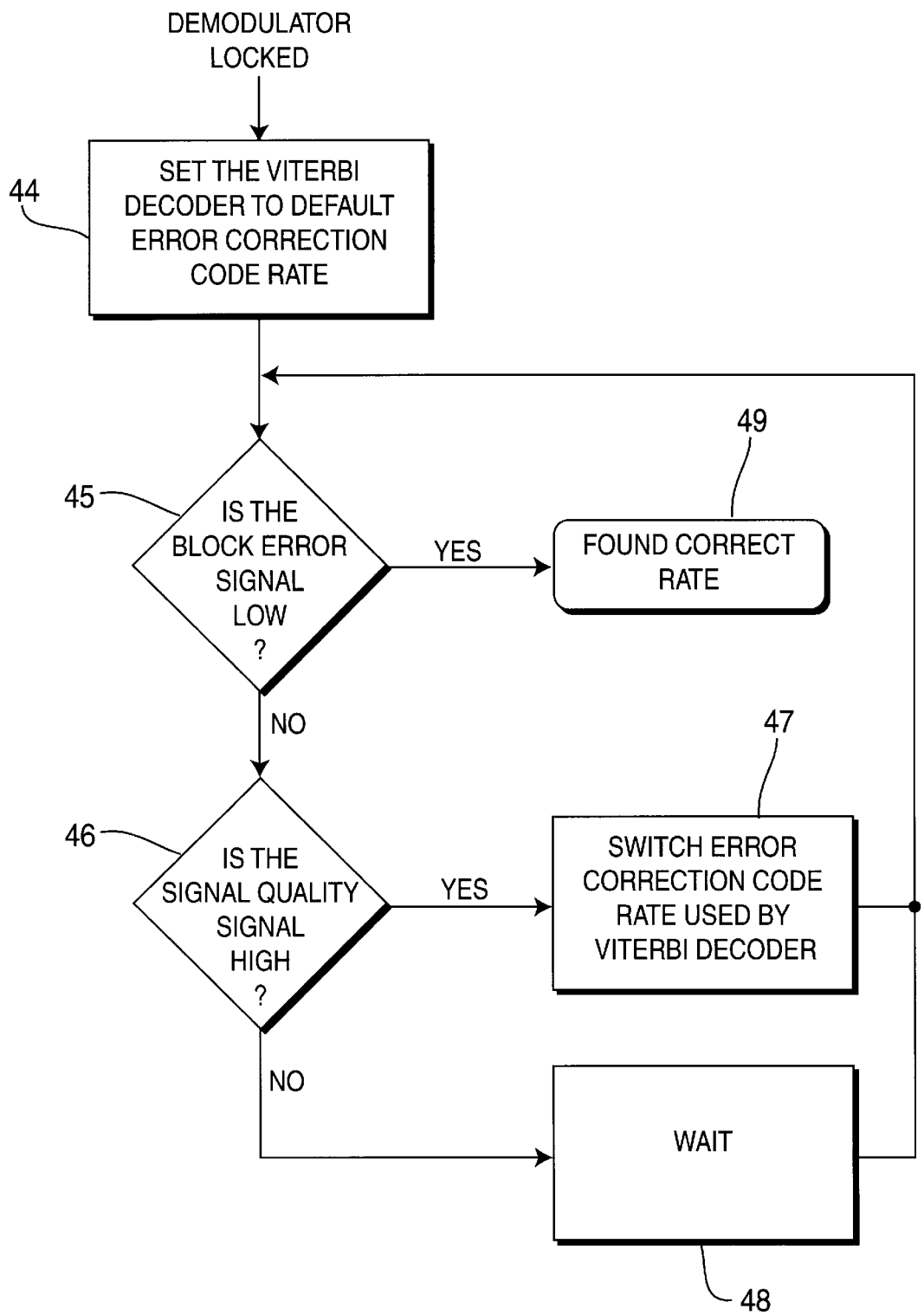
FIG. 4 is a flowchart to aid in understanding another sequence of events which occur in controlling the apparatus of FIG. 2.

As another example, the Signal Quality signal from QPSK demodulator 25 may be used to determine if the wrong error correction code rate is being used by Viterbi decoder 26. FIG. 4 (considered with FIG. 2) illustrates the sequence of events which occur in this case. In FIG. 4, steps 44, 45 and 49 respectively correspond to steps 34, 35 and 39 in FIG. 3. FIG. 4 differs in that steps 46, 47 and 48 have been added.

When QPSK demodulator 25 initially achieves synchronization (lock) with the data signal, Viterbi decoder 26 is set to a default code rate (step 44) as discussed. Viterbi decoder 26 then attempts to synchronize itself with the demodulated data signal. If synchronization is achieved, de-interleaver 27 and RS decoder 28 receive a decodable signal. RS decoder 28 then generates a low level Block Error signal to indicate proper decoding (step 45). Microprocessor 6 senses the low level Block Error signal, and determines that the proper error correction code rate is being used by the Viterbi decoder (step 49).

In contrast, if Viterbi decoder 26 is unable to synchronize with the data signal, de-interleaver 27 and RS decoder 28 receive an undecodable data signal from Viterbi decoder 26. De-interleaver 27 and RS decoder 28 will then be unable to operate properly upon the data signal, and RS decoder 28 will generate a high level Block Error signal representing this condition. Microprocessor 6 senses (via comparator 23) the Signal Quality signal supplied by the QPSK demodulator (step 46). If the level of the Signal Quality signal is high, indicating that RS decoder 28 should have been able to decode the data signal, then microprocessor 6 generates a Code Rate signal instructing Viterbi decoder 26 to switch error correction code rates (step 47).

If the level of the Signal Quality signal is low, indicating that the RS decoder could not produce a sufficiently decoded signal even if Viterbi decoder 26 were using the proper error correction coding rate, microprocessor 6 will not cause a change in the error correction code rate of Viterbi decoder 26. This condition may occur as a result of a rain fade, for example. Microprocessor 6 then waits a specified period of time (step 48) before sampling the Block Error signal, to allow decoder 26 time to synchronize itself at the current error correction code rate. If the Block Error signal remains at a high level (indicating improper decoding), microprocessor 6 will again sample the Signal Quality signal. Microprocessor 6 will sample the Block Error signal several times at predetermined intervals until proper decoding is indicated by the Block Error signal. As shown in FIG. 4, microprocessor 6 will continue sampling both the Block Error signal and the Signal Quality signal, and will instruct Viterbi decoder 26 to change the error correction code rate or to wait a specified period of time until the Block Error signal exhibits a low level, indicating proper decoding.

The following table summarizes the conditions described above with respect to the possible states (levels) of the Signal Quality and Block Error control signals.

| Signal Quality | Block Error | Comments |
| --- | --- | --- |
| HIGH | LOW | Normal Operating condition |
| LOW | LOW | Correct code rate; poor signal |
| LOW | HIGH | Undetermined cause (rain fade); wait |
| HIGH | HIGH | Incorrect code rate; switch code rate |

Viterbi decoder 26 may operate in response to more than two error correction code rates, depending upon the requirements of a particular system. Similarly, the described control signals could indicate a particular state or value with a high or a low logic level. Encoder and decoder networks other than Viterbi and Reed-Solomon may be used in apparatus incorporating the invention.

What is claimed is:

1. In a receiver for processing an input signal received from a satellite transmission channel, said input signal containing encoded intelligence and error correction code rate information, apparatus comprising:

a decoder network for decoding said input signal in association with an error correction decode rate; and a control network coupled to said decoder network for providing a control signal representing desired or undesired decoding by said decoder network; wherein said decoder network self-adjusts to operate with a new error correction decode rate as a function of the condition of said control signal exclusive of error-related communications from said receiver to an associated encoder at a transmitter via a return satellite channel, and from said transmitter to said decoder network.

2. Apparatus according to claim 1, wherein said decoder network self-adjusts to operate with a correct error correction decode rate when said control signal represents incorrect decoding by said decoding network.

3. In a receiver for processing an input signal received from a satellite transmission channel, said input signal containing encoded intelligence and error correction code rate information, apparatus comprising:

a decoder network for decoding said input signal in association with an error correction decode rate; and a control network coupled to said decoder network for providing a control signal representing desired or undesired decoding by said decoder network; wherein said decoder network self-adjusts to operate with a new error correction decode rate as a function of the condition of said control signal; and said input signal is a satellite signal subject to being transmitted at different power levels with respectively associated different error correction code rates.

4. Apparatus according to claim 1, wherein said control network responds to a Quality signal representing the quality of said input signal.

5. Apparatus according to claim 4, wherein said control network responds to both said Quality signal and to an Error signal representing the error correction status of said decoder, so that said decoder network self-adjusts to operate with a new error correction decode rate in response to the condition of both said Quality signal and said Error signal.

6. In a receiver for processing an input signal received from a satellite transmission channel, said input signal containing encoded intelligence and error correction code rate information, apparatus comprising:

a decoder network for decoding said input signal in association with an error correction decode rate; and a control network coupled to said decoder network for providing a control signal representing desired or undesired decoding by said decoder network; wherein said decoder network self-adjusts to operate with a new error correction decode rate as a function of the condition of said control signal;

said decoder network comprises a convolutional decoder and a Reed-Solomon decoder; and said control signal represents the decoding status of said Reed-Solomon decoder.

7. Apparatus according to claim 6, wherein said convolutional decoder is a Viterbi decoder.

8. Apparatus according to claim 1, wherein said control network responds to a Sync signal indicative of said apparatus being synchronized or unsynchronized with said input signal.

9. Apparatus according to claim 8 and further including means for demodulating said input signal; wherein said Sync signal is indicative of synchronization of said demodulating means with said input signal.

10. In a receiver for processing an input signal received from a satellite transmission channel, said input signal containing encoded intelligence and error correction code rate information, a signal processing method comprising the steps of:

decoding said input signal in association with an error correction decode rate;

generating a control signal representing desired or undesired decoding by said decoding step; and self-adjusting to operate with a new error correction decode rate in said decoding step in response to a predetermined condition of said control signal exclusive of error-related communications from said receiver to an associated encoder at a transmitter via a return satellite channel, and from said transmitter to said decoder network.

* * * * *